United States Patent [19]

Sun

[11] Patent Number: 5,496,764
[45] Date of Patent: Mar. 5, 1996

[54] PROCESS FOR FORMING A SEMICONDUCTOR REGION ADJACENT TO AN INSULATING LAYER

[75] Inventor: Shih-Wei Sun, Austin, Tex.

[73] Assignee: Motorola, Inc., Schaumburg, Ill.

[21] Appl. No.: 270,542

[22] Filed: Jul. 5, 1994

[51] Int. Cl.⁶ ................................................. H01L 21/76
[52] U.S. Cl. ......................... 437/67; 437/62; 437/974; 148/DIG. 12; 148/DIG. 135
[58] Field of Search .............................. 437/67, 62, 974; 148/DIG. 12, DIG. 135

[56] References Cited

U.S. PATENT DOCUMENTS

| | | | |
|---|---|---|---|
| 4,837,177 | 6/1989 | Lesk et al. | 437/31 |
| 4,968,628 | 11/1990 | Delgado et al. | 437/62 |
| 4,971,925 | 11/1990 | Alexander et al. | 437/62 |
| 5,025,304 | 6/1991 | Reisman et al. | 357/71 |
| 5,091,330 | 2/1992 | Cambou et al. | 437/62 |
| 5,164,218 | 11/1992 | Tsuruta et al. | 448/DIG. 12 |
| 5,268,326 | 12/1993 | Lesk et al. | 437/62 |
| 5,312,782 | 5/1994 | Miyazawa | 437/62 |
| 5,323,059 | 6/1994 | Rutter et al. | 257/768 |

FOREIGN PATENT DOCUMENTS

| | | | |
|---|---|---|---|
| 63-90859 | 4/1988 | Japan | G02F 1/13 |
| 0189133 | 7/1989 | Japan | 437/62 |
| 0005545 | 1/1990 | Japan | 437/62 |
| 0177435 | 7/1990 | Japan | 437/62 |

OTHER PUBLICATIONS

Watanabe, et al.; "A Bonded–SOI Bipolar Process Technology;" Extended Abstracts; Elec. Chem. Soc.; p. 744 (1991).
Wolf; Silicon Processing For The VLSI Era–Vol II; Lattice Press; pp. 70–72 (1990).
Gaul, et al.; "An Evaluation of SOI Technologies for High Performance Analog Bipolar Circuits;" 1989 IEEE SOS/SOI Technology Conference; pp. 101–102 (1989).
Delgado, et al.; "Comparison of Fabrication Methods for Bonded Wafer SOI;" 1988 IEEE SOS/SOI Technology Workshop; p. 58 (1988).
Wolf; "Silicon Processing for the VLSI Era"; vol. 1: Process Technology; Lattice Press, pp. 26–27, 1986.

*Primary Examiner*—Tom Thomas
*Assistant Examiner*—Trung Dang
*Attorney, Agent, or Firm*—George R. Meyer

[57] ABSTRACT

An insulating layer is formed over a first substrate. Trenches are formed within a second substrate, and those trenches are filled with an insulating layer. The two substrate are bonded at their insulating layers. The portion of the second substrate away from the trenches is removed to form semiconductor regions over the insulating layer of the first substrate. Embodiments of the present invention allow better thickness control for SOI regions and lower leakage current compared to SOI layers that use LOCOS-type field isolation.

28 Claims, 3 Drawing Sheets

PROCESS FOR FORMING A SEMICONDUCTOR REGION ADJACENT TO AN INSULATING LAYER

FIELD OF THE INVENTION

The present invention relates to processing semiconductor substrates, and in particular, to forming semiconductor regions adjacent to an insulating layer.

BACKGROUND OF THE INVENTION

Silicon-on-insulator (SOI) regions may be formed by bonding substrates together and polishing back a portion of one of the substrates. Thickness control of the substrate being polished back is typically difficult because there is no polish stop. Therefore, the thickness of the silicon layer over the insulator may be variable from substrate to substrate.

SUMMARY OF THE INVENTION

The present invention includes a process for forming a semiconductor region adjacent to an insulating layer comprising the steps of: forming a first insulating layer over a first substrate having a first conductivity type; forming trenches within a second substrate; forming a second insulating layer within the trenches; bonding the first and second substrates together such that the first and second insulating layers are adjacent to each other; and removing a portion of the second substrate to expose portions of the second insulating layer.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

A process for forming trench isolation prior to bonding two semiconductor substrates together is disclosed. By forming the trench isolation before bonding, the insulating material within the trench may be used in endpoint detection of a dry etching or chemical-mechanical polishing process in removing most of one of the bound substrates. The insulating layer within the trenches acts as field isolation and has substantially vertical edges. The trench field isolation between the SOI regions produces metal-oxide-semiconductor (MOS) transistors with lower leakage current compared to MOS transistors that are formed within an SOI layer with LOCOS-type field isolation. The present invention is better understood with the embodiments that are described below.

Trench SOI

Figure 1:
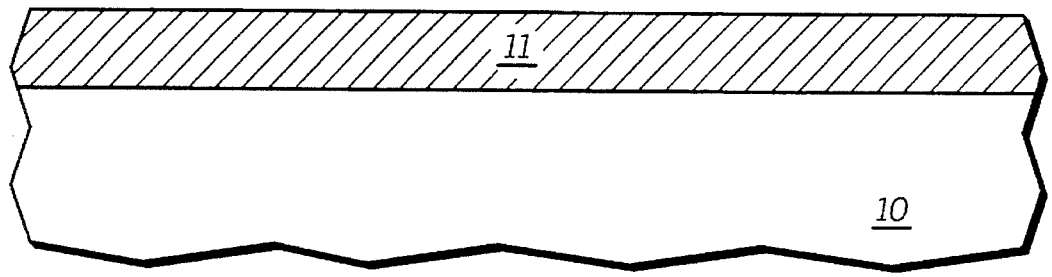
FIG. 1 includes an illustration of a cross-sectional view of a portion of a first semiconductor substrate with an insulating layer overlying the substrate.
Figure 2:
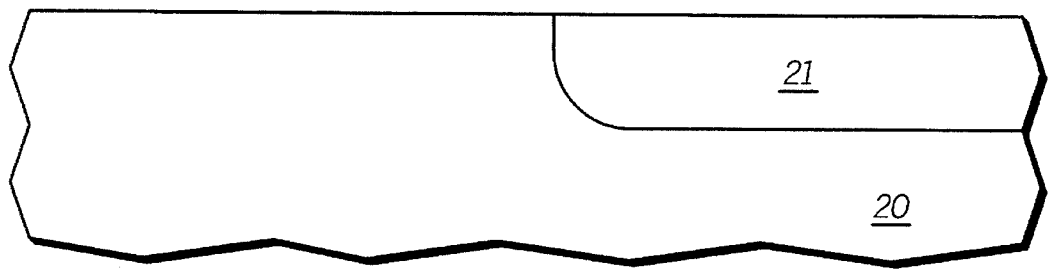
FIG. 2 includes an illustration of a cross-sectional view of a portion of a second semiconductor substrate with a doped region within the substrate.

FIG. 1 includes an illustration of a cross-sectional view of a portion of a semiconductor substrate 10. An insulating layer 11 is formed over the primary surface of the substrate 10. The insulating layer typically includes silicon dioxide and is in a range of about 1000–5000 angstroms thick. The thickness of the insulating layer 11 should be sufficient to avoid forming a high capacitance capacitor between subsequently formed active regions that will lie over the insulating layer 11 and the substrate 10. An n-type doped region 21 is formed near the primary surface of the substrate 20. Region 21 may include phosphorus and is diffused into a substrate 20 to a depth of at least 1000 angstroms.

Figure 3:
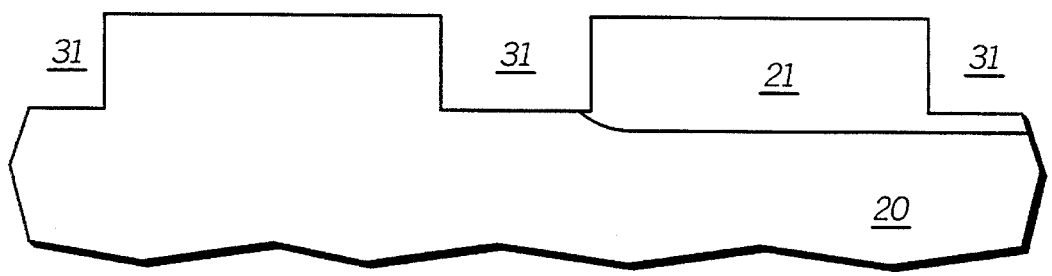
FIG. 3 includes an illustration of a cross-sectional view of the substrate of FIG. 2 after forming trenches.

After forming the region 21, silicon trenches 31 are formed within the substrate 20 as shown in FIG. 3. The trenches 31 generally are no more than 3000 angstroms deep. The trenches 31 may have nearly any width, but the narrowest trenches 31 are generally are about 0.1 to 1.0 micron wide. The depth of the trench is in part determined by whether or not the SOI regions are to be fully depleted or only partially depleted. If these regions are to be fully depleted, the trenches should be less than 1000 angstroms deep and may only be 500 angstroms deep. If the regions are only to be partially depleted, the trenches may be in a range of about 1000– 3000 angstroms deep.

Figure 4:
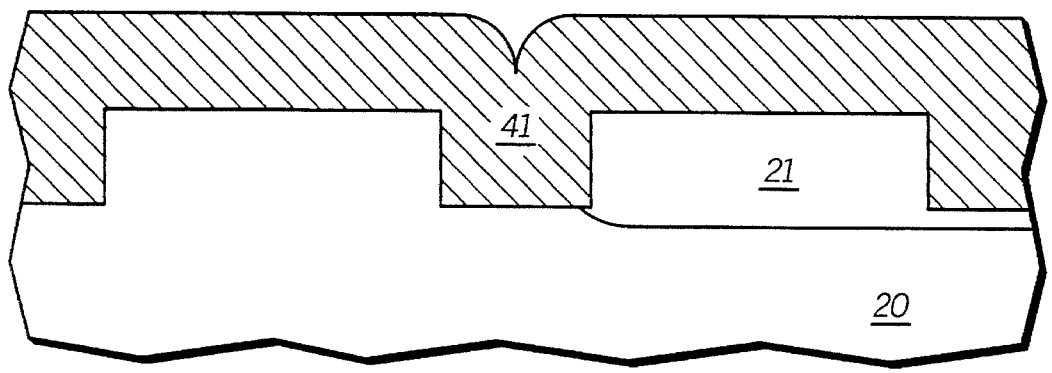
FIG. 4 includes an illustration of a cross-sectional view of the substrate of FIG. 3 after forming an insulating layer within the trenches and overlying the substrate.
Figure 5:
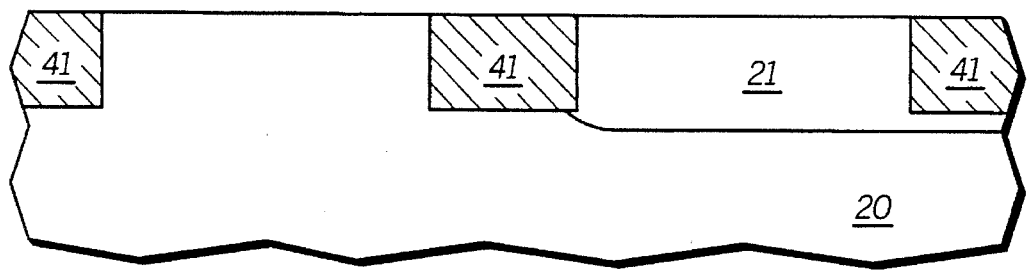
FIG. 5 includes an illustration of a cross-sectional view of the substrate of FIG. 4 after removing a portion of the insulating layer.

An insulating layer 41 is formed over the substrate and within the trenches as shown in FIG. 4. The insulating layer 41 typically includes silicon dioxide and is generally deposited to a thickness at least sufficient to fill in the trenches. Therefore, the insulating layer 41 typically is in a range of about 500–3000 angstroms thick. That portion of the insulating layer 41 that overlies the substrate 20 and doped region 21 outside of the trenches is removed as shown in FIG. 5.

Figure 6:
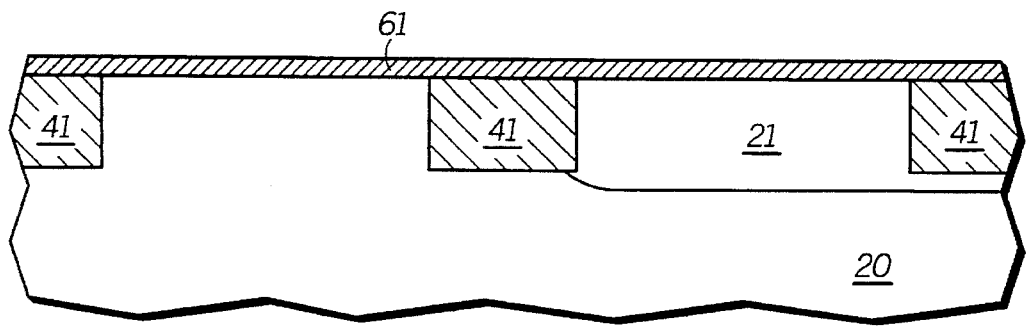
FIG. 6 includes an illustration of a cross-sectional view of the substrate of FIG. 5 after forming another insulating layer.

At this point in processing, a number of options are available with the insulating layer 41. In one embodiment, the insulating layer 41 is polished with an oxide polishing step to remove the insulating layer 41 that lies over the semiconductor substrate 20 and doped region 21 adjacent to the trenches. After exposing the substrate 20 and doped region 21, a thin oxide layer 61 may be formed over the substrate or only over the exposed portions of substrate 20 and doped region 21. FIG. 6 includes a illustration of the substrate where the thin insulating layer 61 is formed over the entire surface of the substrate and insulating layer 41. The oxide layer 61 typically has a thickness less than 200 angstroms and more specifically has a thickness in a range of 50–150 angstroms thick. The oxide layer 61 may be formed by thermal oxidation or a deposition.

In an alternate embodiment (not shown), the insulating layer 41 may be polished to form a planarized insulating layer 41. In this embodiment, the substrate 20 and doped region 21 are not exposed. This embodiment is not shown in the figures. Similar to the previous embodiment, an insulating layer lies over the substrate 20 and doped regions 21. In a further embodiment, the substrate 20 and doped region 21 are exposed similar to the previous embodiment, but the oxide layer 61 is not formed.

Figure 7:
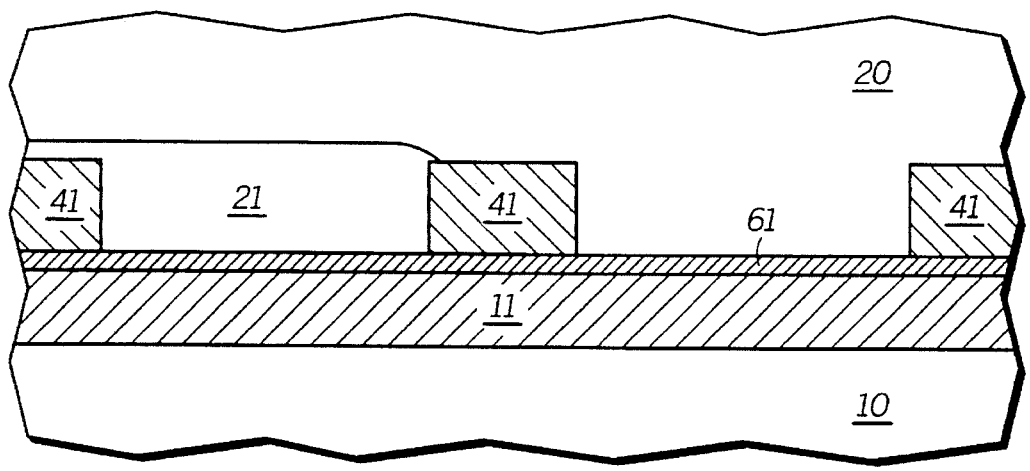
FIG. 7 includes an illustration of a cross-sectional view of the substrates of FIG. 1 and 6 after bonding the substrates together.

At this point in the process the substrates 10 and 20 are bound together at their insulating and/or oxide layer interfaces as shown in FIG. 7. The bonding is performed by annealing the wafers at a temperature in a range of 1000–1200 degrees Celsius for a time in a range of 2–5 hours. The ambient during the anneal may include inert gases or oxidizing gases but the ambient does not require both to be present. In FIG. 7, the thin oxide layer 61 and insulating layer 11 are fused together. In the alternative embodiment (not shown), the planarized insulating layer 41 and insulating layer 11 are fused together. In the further embodiment the insulating layer 11 may be directly bonded to the substrate 20 and doped region 22. The insulating layer 11 is fused to the insulating layer 41 that lies within the trenches.

Figure 8:
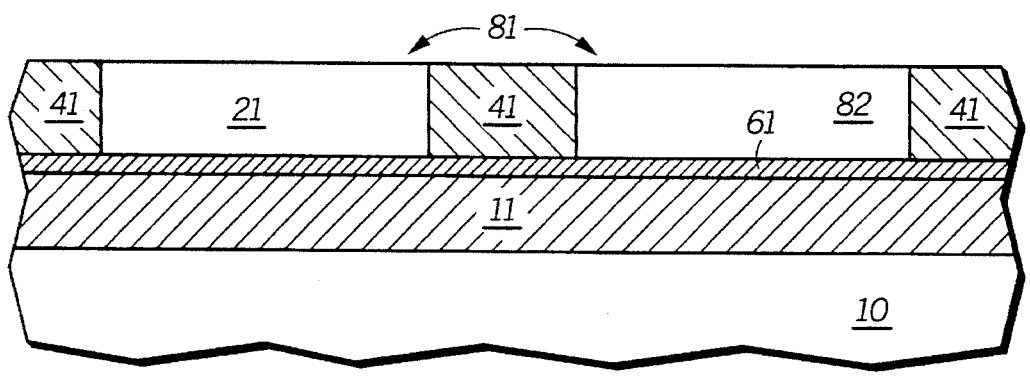
FIG. 8 includes an illustration of a cross-sectional view of the substrate of FIG. 7 after removing most of the second substrate.

The substrate 20 and doped region 21 that extend beyond the trenches 41 are removed as shown in FIG. 8. The removal process is typically formed in two different steps. In the first step, a gross polishing step is performed that quickly removes most of the substrate 20. The second step etches the portions of substrate 20 and doped region 21 that remain after the polishing step. The second step is typically performed as a dry plasma etch, although a wet chemical etch may be used. The dry etching may be performed so that endpoint detection occurs when the insulating layer 41 within the trenches is reached. The etch may be extended for a small time period after the endpoint is detected to account for nonuniformities during the polish and etching steps. Semiconductor regions 81 are formed during the removal steps. The regions 81 are monocrystalline. The right-hand region 81 is an active region 82 for a subsequently formed MOS transistor, and the left-hand region 81 is an active region 21 for a subsequently formed bipolar transistor. The remaining portions of the insulating layer 41 act as field isolation regions.

In another embodiment, the substrate 20 and doped region 21 may be chemical-mechanical polished to form regions 81. Similar to the previous embodiment, the insulating layer 41 within the trenches acts as a polish stop.

Figure 9:
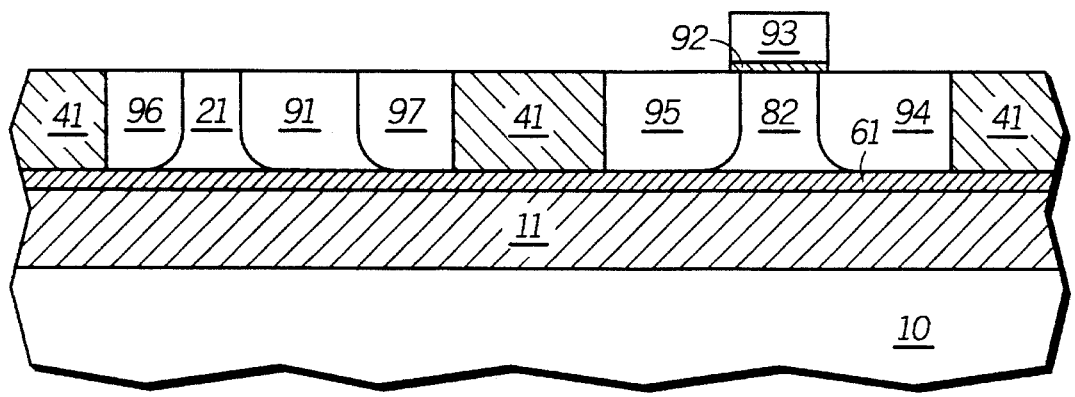
FIG. 9 includes an illustration of a cross-sectional view of the substrate of FIG. 8 after forming transistors.

Further processing is performed to form the transistors, as shown in FIG. 9. The base region 91 is formed from a portion of doped region 21 and may include both an intrinsic base and extrinsic base. Base region 91 typically includes a p-type dopant including boron or the like. A gate dielectric layer 92 is formed over the active region 82, and a gate electrode 93 is formed over the gate dielectric layer 92. The gate dielectric layer 92 may include silicon dioxide, silicon nitride, or a nitrided oxide, and the gate electrode 93 typically includes a silicon-containing or metal-containing material. After the gate electrode 93 has been formed, doped regions 94–97 are then formed. These regions typically include an n-type dopant, such as arsenic and the like, and are formed such that ohmic contacts may be made to these regions. Region 94 acts as a drain region, 95 acts as a source region, 96 acts as a collector contacting region, and region 97 acts as an emitter.

Figure 10:
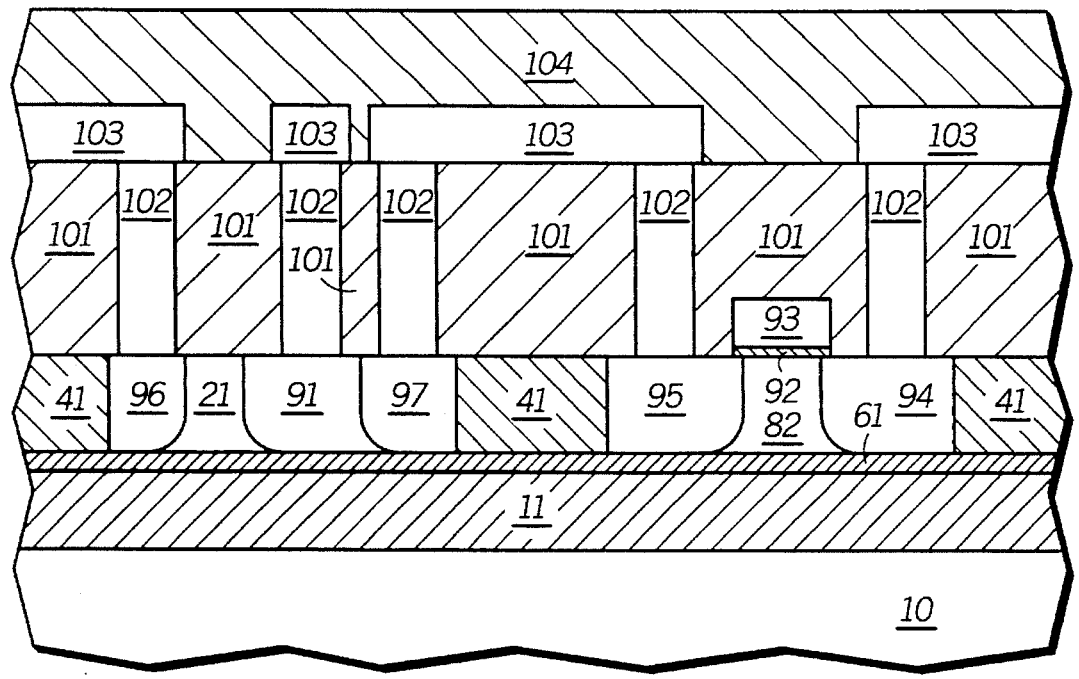
FIG. 10 includes an illustration of a cross-sectional view of the substrate of FIG. 9 after forming a substantially completed device.

After the transistors have formed, the processing is continued to form a substantially completed device as shown in FIG. 10. An insulating layer 101 is formed over the entire surface of the substrate 10. The insulating layer is typically a doped oxide, such as borophosphosilicate (BPSG) and the like. Contact openings are formed within the insulating layer 101 and are filled with contact plugs 102 that are conductive and usually include a silicon-containing or metal-containing material (polysilicon or tungsten, for example). Interconnects 103 and a passivation layer 104 are then formed. The interconnects 103 may include a metal containing material, such as aluminum or copper, and the passivation layer 104 typically includes a doped oxide, such as phosphosilicate glass (PSG) and the like; silicon nitride; or silicon oxynitride.

Note that within this embodiment, regions 95 and 97 are electrically connected to one another via the contact plugs 102 and one of the interconnects 103. This particular interconnect 103 may be connected to a $V_{SS}$ electrode (not shown). The interconnects 103 that are electrically connected to regions 91, 94, and 96 may be electrically connected to other portions of the device that are not shown. An electrical connection to gate electrode 93 is formed but is not shown in FIG. 10. Additional insulating layers, via openings and plugs, interconnect levels, or other electrical connections may be formed, if needed. The device shown in FIG. 10 is just one example and is meant to illustrate and not limit the present invention.

As seen in FIG. 10, an n-channel MOS transistor and an npn bipolar transistor have been formed. In alternative embodiments a plurality of each of these transistors may be formed or pnp bipolar and p-channel MOS transistors could also have been formed. Also, other types of components including diodes, resistors, capacitors, or the like may have been formed in place of or in conjunction with the transistors. Note that the doped region 21 acts as part of the collector for the npn bipolar transistor and is formed prior to bonding the two wafers together. Doped region 21 could have been formed after the trenches have been formed. In addition, n-well or p-well regions for p-channel MOS transistors, pnp bipolar transistors, or n-channel MOS transistors may have been formed similar to doped region 21.

Benefits

One benefit of the embodiment previously described is better control over the thickness of the semiconductor regions 81 that overlie the insulating layer 11. More specifically, the insulating layer 41 within the trenches may be used as an endpoint detection for a dry etching or chemical-mechanical polishing step when forming the regions 81. Compare this to the conventional prior art process which does not have any endpoint detection. Without endpoint detection, either a timed etch or polish must be used or the substrate must be periodically measured to determine the thickness of the SOI layer. Periodically measuring the thickness of the SOI layer is time consuming or does not give as much control as endpoint detection process would.

Another benefit of the present invention is that it allows the active regions for the bipolar and MOS transistors to be formed with nearly vertical edges. In fully depleted MOS transistors, the depletion region of a fully depleted MOS transistor is about equivalent to the thickness of the SOI region. If the thickness of the SOI region varies, the threshold voltage will likewise vary. For example, in a conventional local oxidation of silicon (LOCOS) field isolation process, the LOCOS field isolation regions typically cause the SOI layer to be locally thinner near the edge of the field isolation regions. This thinning of the SOI layer near the edge of the field isolation regions causes a relatively high sub-threshold leakage current. In other words, an MOS transistor formed within an SOI layer adjacent to the LOCOS field isolation region is likely to have significant drain current even when potential on the MOS transistor's gate electrode is below the MOS transistor's threshold voltage (leakage current). High leakage current is undesired.

The embodiments of the present invention have better control of the depletion region compared to an SOI layer that uses LOCOS field isolation regions. The insulating layer 41 within the trenches act as field isolation and do not encroach into the active region. The thickness of the regions 81 should be relatively uniform underneath all of the gate electrode 93. For a fully depleted device, the uniform thickness translates to a relatively uniform threshold voltage across the entire channel region of the MOS transistor. With the embodiment of the present invention leakage current is smaller than if conventional LOCOS field isolation regions are used. Other field isolation regions that do not have substantially vertical edges are expected to have problems similar to the LOCOS field isolation regions.

Yet another benefit of the present invention is its ability to be integrated into a process flow without the need for developing any complicated processing steps. Therefore, many types of devices may be integrated into the present invention without a great deal of integration-related problems.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a semiconductor region adjacent to an insulating layer comprising the steps of:

forming a first insulating layer over a first substrate;

forming a doped region within a second substrate, wherein:
the doped region has a first conductivity type;
the second substrate has a second conductivity type that is opposite the first conductivity type; and
this step is performed before bonding the first and second substrates;

forming a trench within a second substrate, wherein the trench is no wider than 1.0 micron;

forming a second insulating layer within the trench;

bonding the first and second substrates together such that the first and second insulating layers are adjacent to each other; and removing a portion of the second substrate to expose portions of the second insulating layer to form a first active region from the doped region and a second active region from the second substrate, wherein:
the first active region has the first conductivity type and the second active region has the second conductivity type; and
the first and second active regions lie on opposite sides of the trench.

2. The process of claim 1, wherein:

the step of forming the trench is performed such that the first active region is formed from the doped region; and the step of forming the trench is performed after forming the doped region.

3. The process of claim 1, wherein the step of removing includes:

polishing away most of the second substrate; and etching a remaining portion of the second substrate to expose portions of the second insulating layer.

4. The process of claim 1, wherein the trenches are formed to a depth no deeper than 3000 angstroms.

5. The process of claim 1, further comprising steps of:

forming a gate electrode over at least one of the first and second active regions, wherein the at least one of the first and second active regions has a uniform thickness under the gate electrode; and forming source and drain regions within the at least one of the first and second active regions and adjacent to the gate electrode.

6. The process of claim 1, further comprising a step of planarizing the second insulating layer prior to the step of bonding.

7. The process of claim 6, further comprising a step of forming a third insulating layer over the second insulating layer between the steps of planarizing and bonding, wherein the third insulating layer has a thickness no thicker than 200 angstroms.

8. A process for forming a semiconductor region adjacent to an insulating layer comprising the steps of:

forming a first insulating layer over a first substrate;

forming trenches within a second substrate;

forming a second insulating layer within the trenches and over the second substrate;

planarizing the second insulating layer;

bonding the first and second substrates together such that the first and second insulating layers are adjacent to each other;

polishing the second substrate to remove most of the second substrate; and etching the second substrate to expose portions of the second insulating layer.

9. The process of claim 8, further comprising a step of forming a doped region within the second substrate prior to the step of bonding, wherein the doped region and the second substrate have opposite conductivity types.

10. The process of claim 8, wherein the steps of polishing and etching are performed to form a first active region and a second active region.

11. The process of claim 8, wherein the trenches are formed to a depth no deeper than 3000 angstroms.

12. The process of claim 10, further comprising steps of:

forming a gate electrode over at least one of the first and second active regions, wherein the at least one of the first and second active regions has a uniform thickness under the gate electrode; and forming source and drain regions within the at least one of the first and second active regions and adjacent to the gate electrode.

13. The process of claim 8, further comprising a step of forming a third insulating layer over the second insulating layer between the steps of planarizing and bonding, wherein the third insulating layer has a thickness no thicker than 200 angstroms.

14. A process for forming a semiconductor region adjacent to an insulating layer comprising the steps of:

forming a first insulating layer over a first substrate;

forming trenches within a second substrate, wherein the trenches have a depth no deeper than 3000 angstroms;

forming a second insulating layer within the trenches and over the second substrate;

polishing the second insulating layer to form exposed portions of the second substrate;

forming a third insulating layer over the exposed portions of the second substrate;

bonding the first and second substrates together such that the first and third insulating layers are adjacent to each other;

polishing the second substrate to remove most of the second substrate; and etching the second substrate to expose portions of the second insulating layer.

15. The process of claim 14, further comprising a step of forming a doped region within the second substrate prior to the step of forming the second insulating layer, wherein the doped region and the second substrate have opposite conductivity types.

16. The process of claim 14, wherein the trenches are formed to a depth no deeper than 1000 angstroms.

17. The process of claim 14, wherein the second insulating layer has a thickness no thicker than 200 angstroms.

18. The process of claim 14, wherein the steps of polishing and etching are performed to form a first active region and a second active region, wherein:

the first and second active regions lie on opposite sides of one of the trenches that is no wider than 1.0 micron.

19. The process of claim 18, further comprising steps of:

forming a gate electrode over at least one of the first and second active regions, wherein the at least one of the first and second active regions has a uniform thickness under the gate electrode; and forming source and drain regions within the at least one of the first and second active regions and adjacent to the gate electrode.

20. The process of claim 18, further comprising steps of:

forming an MOS transistor within one of the first and second active regions; and forming a bipolar transistor within the other of the first and second active regions.

21. The process of claim 15, wherein the step of forming the doped region is performed prior to the step of forming the trenches.

22. The process of claim 15, wherein the step of forming the doped region is performed after the step of forming the trenches.

23. The process of claim 1, further comprising steps of:

forming an MOS transistor within one of the first and second active regions; and forming a bipolar transistor within the other of the first and second active regions.

24. The process of claim 8, wherein the step of etching is performed using a dry etching technique.

25. The process of claim 24, wherein the step of etching comprises:

etching the second substrate until an endpoint is detected; and etching the second substrate for a time period after the endpoint is detected.

26. The process of claim 9, wherein the step of forming the doped region is performed prior to the step of forming the trenches.

27. The process of claim 9, wherein the step of forming the doped region is performed after the step of forming the trenches.

28. The process of claim 10, further comprising steps of:

forming an MOS transistor within one of the first and second active regions; and forming a bipolar transistor within the other of the first and second active regions.

* * * * *